(12) United States Patent
Donlin

(10) Patent No.: US 8,271,911 B1
(45) Date of Patent: Sep. 18, 2012

(54) PROGRAMMABLE HARDWARE EVENT REPORTING

(75) Inventor: Adam P. Donlin, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 1405 days.

(21) Appl. No.: 11/901,100

(22) Filed: Sep. 13, 2007

(51) Int. Cl.
*G06F 17/50* (2006.01)

(52) U.S. Cl. ........ 716/100; 716/106; 716/116; 716/117; 716/136; 716/138

(58) Field of Classification Search .......... 716/106–108, 716/116–117, 100, 136–138
See application file for complete search history.

(56) References Cited

U.S. PATENT DOCUMENTS

| | | | |
|---|---|---|---|
| 5,963,726 A | 10/1999 | Rust et al. | |
| 6,704,889 B2 | 3/2004 | Vennstra et al. | |
| 7,024,427 B2 | 4/2006 | Bobbitt et al. | |
| 7,127,678 B2 | 10/2006 | Bhesania et al. | |
| 7,207,041 B2 | 4/2007 | Elson et al. | |
| 7,269,696 B2 | 9/2007 | Muhlestein et al. | |
| 7,337,407 B1 | 2/2008 | Ogami et al. | |
| 2003/0121010 A1* | 6/2003 | Aubury ............................. 716/4 |
| 2003/0191810 A1 | 10/2003 | Muhlestein et al. | |
| 2007/0174366 A1 | 7/2007 | Palapudi et al. | |

OTHER PUBLICATIONS

Donlin, Adam, et al., A Virtual File System for Dynamically Reconfiguration FPGAs, FPL 2004, LNCS 3203, pp. 1127-1129, Springer-Verlag Berlin Heidelberg , Aug. 2004.

Troger, Gerd, TPC Electronics, FPGAs & Dynamic (Re) Configuration—ongoing work, troeger@kip.uni-heidelberg.de, Apr. 7, 2005, pp. 1-27.
Kwok-Hay So, Hayden, et al., Improving Usability of FPGA-based Reconfigurable Computers Through Operating System Support, IEEE , Aug. 28-30, 2006, pp. 1-6.
U.S. Appl. No. 12/426,943, filed Apr. 20, 2009, Lysaght et al.
U.S. Appl. No. 10/812,643, filed Mar. 29, 2004, Donlin et al.
U.S. Appl. No. 12/055,163, filed Mar. 25, 2008, Donlin et al.
U.S. Appl. No. 10/812,643, Adam P. Donlin et al., "Virtual File System Interface to Configuration Data of A PLD", filed Mar. 29, 2004, 29 pages, Xilinx, Inc. 2100 Logic Drive, San Jose, California.
Xilinx, Inc. EDK Concepts, Tools and Techniques, Sep. 18, 2008. pp. 1-92, Xilinx, Inc., 2100 Logic Drive, San Jose, CA.

\* cited by examiner

*Primary Examiner* — Paul Dinh
(74) *Attorney, Agent, or Firm* — LeRoy D. Maunu

(57) ABSTRACT

Approaches for reporting hardware events from circuitry implemented in an integrated circuit (IC). The IC is configured with a circuit to be analyzed and an event monitor circuit. A process invokes an application programming interface (API) function that references an operating system managed object. The API function includes a parameter value that references the object. The process is operated in a first manner when the object is in a first state. An interrupt signal is generated by the event monitor circuit to the processor in response to an input signal from the circuit under analysis, which initiates execution of an interrupt handler. The object is placed in a second state by the interrupt handler. The process is operated in a second manner different from the first manner in response to the object transitioning to the second state.

20 Claims, 5 Drawing Sheets

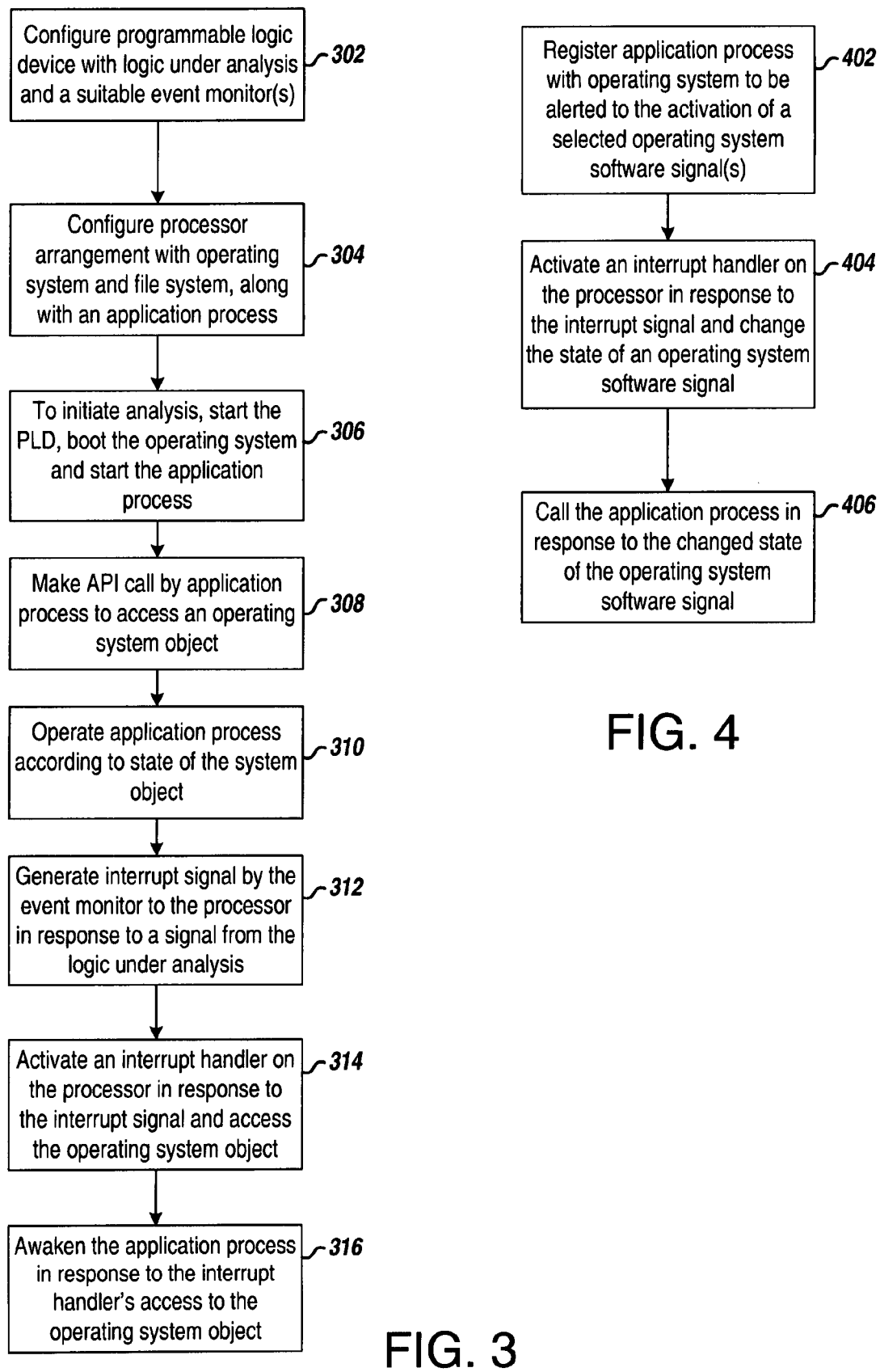

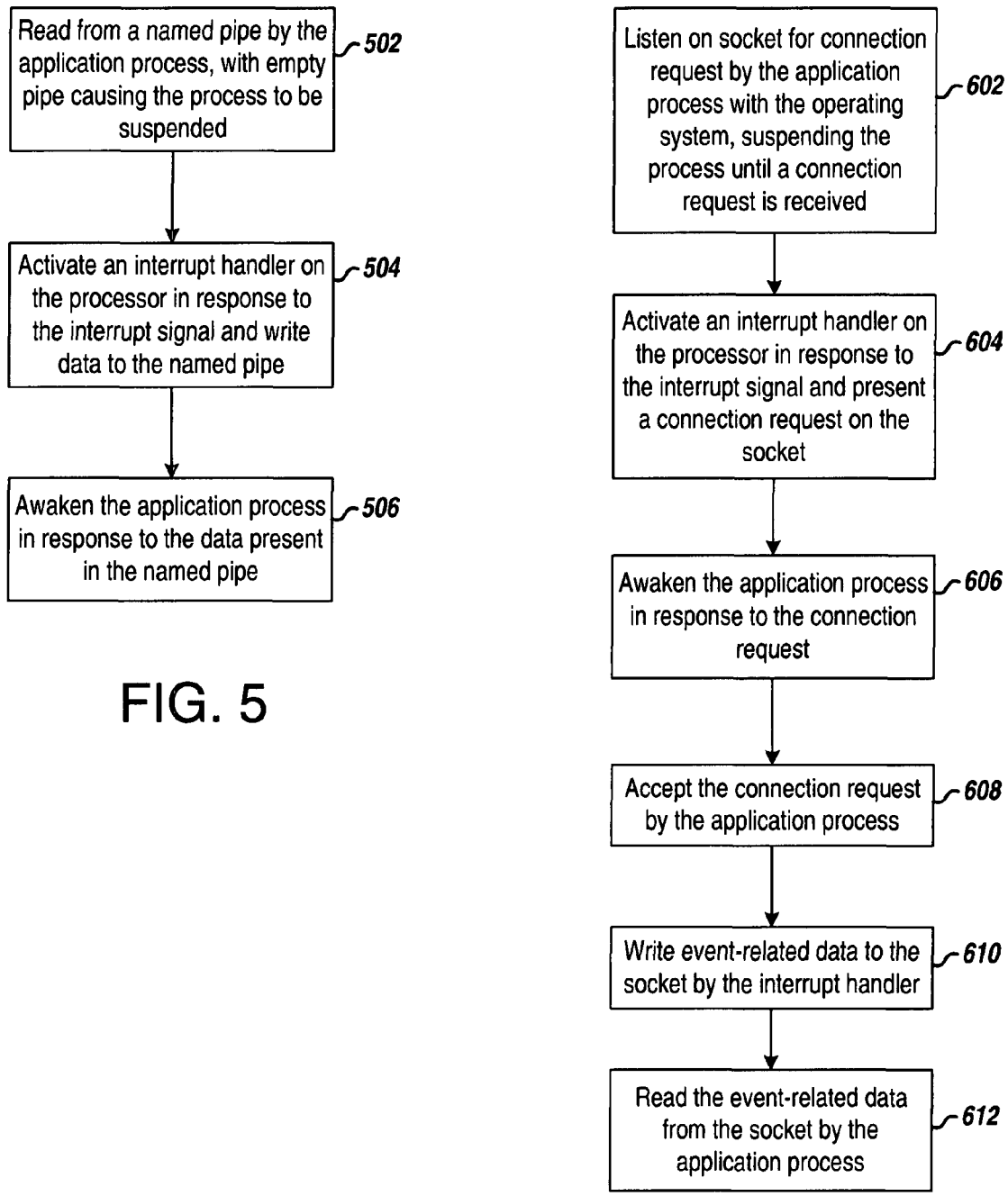

PROGRAMMABLE HARDWARE EVENT REPORTING

FIELD OF THE INVENTION

The present invention generally relates to reporting events occurring in a circuit implemented on a programmable logic device via an operating system software file object.

BACKGROUND

The technology of programmable logic devices (PLDs) has progressed to a level such that it is possible to implement a microprocessor on a PLD and host an operating system such as Linux. Not only may this support various system on a chip (SOC) applications, but with the capabilities of a PLD such as a Virtex™ field programmable gate array (FPGA) from Xilinx, the SOC is reconfigurable to suit changing requirements or adjust to changing environmental conditions.

The configuration of a PLD, such as an FPGA, generally refers to the state of the configurable logic resources of the device as programmed to accomplish a set of required functions. Data that is loaded into the device to program a desired configuration may be referred to as configuration data. The state of the device generally refers to the contents of registers in the device at a chosen time while the device is performing the desired functions.

Devices such as the Virtex FPGA have various modes available for accessing the configuration data and state. For example, for general needs the SelectMap interface of the Virtex FPGA may be used to load a configuration bitstream into the device or read back configuration data from the device. For testing and diagnostic activities, a boundary scan interface may be used to establish or read back state data. The internal configuration access port (ICAP) may be implemented on a Virtex FPGA to manipulate configurable resources after the device has already been configured.

Even though these interfaces for accessing configuration data or device state are suitable for most purposes, the interfaces are low-level (less abstract) and may be unnecessarily complex for some applications. For example, to the developer of an application in which the PLD is to be re-configured while being part of a running system (run-time reconfiguration), the low-level interface may not be familiar. The developer's lack of familiarity may present scheduling, reliability, and cost issues for debugging a circuit design.

The present invention may address one or more of the above issues.

SUMMARY

The various embodiments of the invention provide a number of approaches for reporting hardware events from circuitry implemented in a programmable logic device (PLD). In one embodiment, a method comprises configuring the PLD with a logic circuit and an event monitor circuit. A process invokes an application programming interface (API) function that references an operating system managed object. The API function includes a parameter value that references the object. The process is operated in a first manner when the object is in a first state. An interrupt signal is generated by the event monitor circuit to the processor in response to an input signal from the logic circuit, which initiates execution of an interrupt handler. The object is placed in a second state by the interrupt handler. The process is operated in a second manner different from the first manner in response to the object transitioning to the second state.

In another embodiment, an apparatus is provided for reporting hardware events from circuitry implemented in a programmable logic device (PLD). The apparatus comprises means for configuring the PLD with a logic circuit and an event monitor circuit coupled to the logic circuit; means for invoking by a process an application programming interface (API) function that references an object managed by an operating system (OS) executing on a processor, wherein the invoking of the API function includes a parameter value that references one of a plurality of OS-managed objects; means for operating the process in a first manner in response to the invoking of the API function and the object being in a first state; means for generating an interrupt signal by the event monitor circuit to the processor in response to an input signal from the logic circuit; means for executing an interrupt handler on the processor in response to the interrupt signal; means for accessing the object by the interrupt handler, wherein the object is placed in a second state by the interrupt handler; and means for operating the process in a second manner different from the first manner in response to the object transitioning to the second state.

An electronic system with reporting of hardware events to software is provided in another embodiment. The system comprises a programmable logic device (PLD), an interrupt controller, and a processor. The programmable logic device (PLD) is configured with a logic circuit and an event monitor circuit coupled to the logic circuit. The event monitor is configured to generate an interrupt signal in response to an input signal from the logic circuit. The interrupt controller is coupled to the event monitor circuit and is configured to activate an interrupt handler in response to the interrupt signal. The processor is coupled to the interrupt controller and is configured to execute the interrupt handler, an operating system (OS), and a process. The process invokes an application programming interface (API) function that references an object managed by the OS, and the invoking of the API function includes a parameter value that references one of a plurality of OS-managed objects. The process is configured to operate in a first manner in response to the invoking of the API function and the object being in a first state. The interrupt handler is configured to access and place the object in a second state, and the process is further configured to operate in a second manner different from the first manner in response to the object transitioning to the second state.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which:

FIG. 3 is a flowchart of an example process for detecting and responding to a hardware event on a programmable logic device using API calls to access an operating system object;

FIG. 4 is a flowchart of an example process in which the operating system object used in reporting a hardware event on a programmable logic device is an operating system software signal;

FIG. 5 is a flowchart of an example process in which the operating system object used in responding to a hardware event on a programmable logic device is a named pipe;

FIG. 6 is a flowchart of an example process in which the operating system object used in responding to a hardware event on a programmable logic device is a socket.

DETAILED DESCRIPTION OF THE DRAWINGS

The various embodiments of the invention provide reporting of hardware events from circuitry implemented in a programmable logic device (PLD). Reports of the events are easily accessible to a software process via standard operating system-managed objects and standard interfaces. One or more event monitor circuits are configured on the PLD to detect the desired hardware event(s). In response to detecting a hardware event, the event monitor circuit generates an interrupt signal to a processor, and an interrupt handler is executed on the processor in response to the interrupt signal. The interrupt handler is adapted to access the operating system object associated with the event. The software process receives notification of the event by way of accessing the operating system object via an application programming interface (API) call. The process may be suspended based on the state of the object. The event monitor(s) operate independent of the software process that waits for the events. Once the interrupt handler accesses the object and changes the object's state, the operating system awakens the software process, and the process may take action based on the occurrence of the event.

For example, the event reporting mechanism may be used for analyzing or debugging a hardware design that is implemented on a PLD. That is, output data from the hardware design may be logged, or state data may be read from the hardware design and analyzed. Depending on the design being debugged, the clock may be halted, stepped, or allowed to run freely. The operating system (OS) object provides a simple and easy-to-use interface for a software process to receive notification of hardware events from monitoring circuits that operate independent of the software process.

The various embodiments of the invention use standard, OS-provided objects and interfaces to provide application access to events triggered by PLD-implemented circuitry. Examples of standard objects include software signals and file system objects, such as those supported by the POSIX operating system. In one embodiment, one or more standard OS-provided software signals (e.g., the POSIX SIGSEGV and SIGIO signals) may be used by one or more interrupt handlers to signal the occurrence of one or more events triggered by the PLD-implemented circuitry. In another embodiment, one or more standard OS-provided file system objects (e.g., sockets and/or pipes) may be accessed by one or more interrupt handlers to signal the event occurrence. The wide use of software signal and file system APIs by software developers may reduce the development costs associated with applications needing to act upon PLD triggered events.

Figure 1:
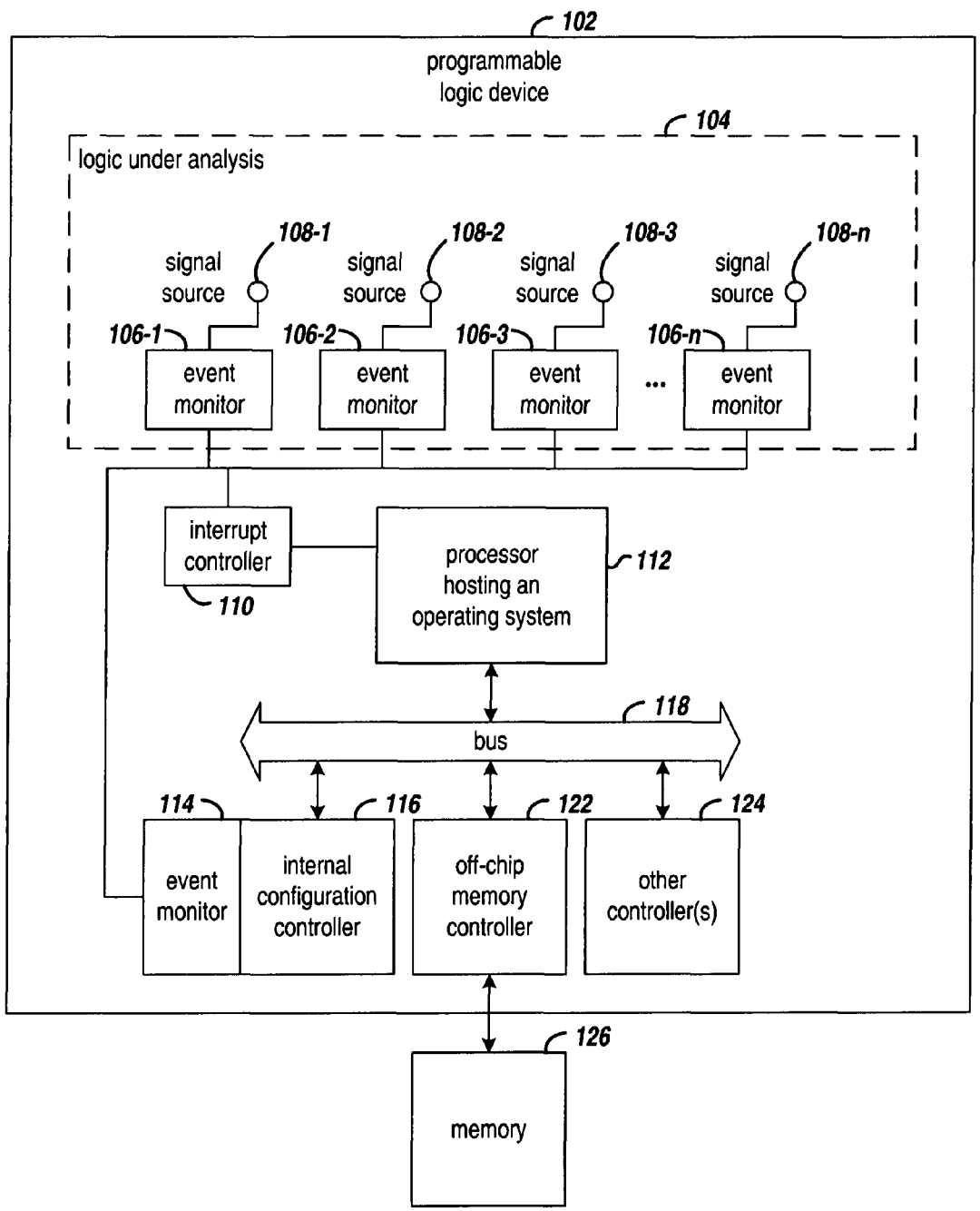
FIG. 1 is a block diagram of an example circuit arrangement in accordance with various embodiments of the invention.

FIG. 1 is a block diagram of an example circuit arrangement in accordance with various embodiments of the invention. The example circuit arrangement is implemented on a programmable logic device (PLD) 102, and the PLD includes logic under analysis 104 and one or more event monitors 106-1-106-n. The event monitors may be implemented as internal modules of the logic under analysis (as shown in FIG. 1) or as external components coupled to output ports of the logic under analysis (not shown). Each event monitor is coupled to a signal source 108-1-108-n in the logic under analysis. The event monitors 106-1-106-n may be implemented as logic analyzer cores that are designed with the logic under analysis. Depending on the analysis requirements and logic under analysis, an event monitor may be coupled to multiple signal sources.

The occurrence of a hardware event is detected by an event monitor and signaled to a software process via the interrupt controller 110 and processor 112. Even though the interrupt controller and processor are shown as being integrated as part of the PLD 102, it will be appreciated that the interrupt controller and/or processor may be located on a device or integrated circuit that is separate from that of the PLD. Through the signaling of an interrupt to the processor, interrupt handler software executing on the processor is executed and the interrupt handler changes the state of a software-accessible object that is managed by the operating system.

Application software may be implemented to respond to a change in state of the object. In using the object to respond to hardware events, the application software first makes an API call to the operating system to access the object. The actions of the application software in accessing the object depend on the state of the object as well as on the particular implementation requirements. Generally, the object is in one state if no event has been reported and in another state when an event has been reported. Example alternative implementations of the actions of the applications software when the state of the object indicates that no event has been reported include returning control to the software and the software polling the object at a later time, suspending execution of the software until an event is reported, and returning control to the application software after registering a callback function that is to be invoked when an event is reported. In response to the change in state of the object, the operating system awakens or resumes execution of the application software.

The software object used to signal the occurrence of a hardware event may be selected according to implementation requirements. For example, the POSIX® interface supports software signals that are analogous to hardware signals (e.g., SIGSEGV for memory events and SIGIO for input/output events). In one embodiment, an OS-provided signal may be used to report events. An application software process may register with the operating system to have a callback function invoked in response to the signal being issued by the operating system. In another embodiment, a socket may be used to indicate the occurrence of an event. With a socket, the application software process may listen for a connection request on a socket, and the interrupt handler may make a connection request on that socket in response to an interrupt signal, which signals the occurrence of the hardware event. When a connection request is present on the socket, the software process resumes and processes the request according to implementation requirements. In another embodiment, a pipe, such as that supported on the UNIX® operating system, may be used by the application software process to receive notification of a hardware event. When the software process calls the operating system to read from the pipe and the pipe is empty, the operating system suspends execution of the software process. The operating system resumes execution of the software process once the interrupt handler has written data in the pipe, which can then be read by the process.

As an alternative to or in combination with the event monitors 106-1-106-n, an event monitor 114 may be implemented to monitor configuration memory of the PLD. The event monitor 114 is coupled to an internal configuration controller 116, which provides access to the configuration state of the PLD over general interconnect circuitry within the device.

For example, in one embodiment, the PLD 102 is a field programmable gate array (FPGA) such as a Virtex FPGA from Xilinx, Inc., and the configuration controller 116 may be implemented with functions such those provided by the internal configuration access port (ICAP) in that FPGA. The configuration controller 116 may also interface with the processor via bus 118.

The event monitor 114 may be configured to continually read back a subset of configuration data from the configuration memory of the PLD via the internal configuration controller 116. In response to detecting a certain state in the configuration data, the event monitor 114 generates an interrupt signal to the interrupt controller 110.

Depending on application and implementation requirements, the PLD may be configured with additional controllers, for example, controllers 122 and 124, that provide access to off-chip resources. For example, controller 122 may be a memory controller that provides access to memory 126. It will be appreciated that a variety of commercially available or proprietary memory architectures and interfaces may be used to implement the memory controller and memory. Other types of controllers, illustrated by block 124, may provide network or communications interfaces and access to persistent storage systems such as tape drives and disk drives.

Figure 2:
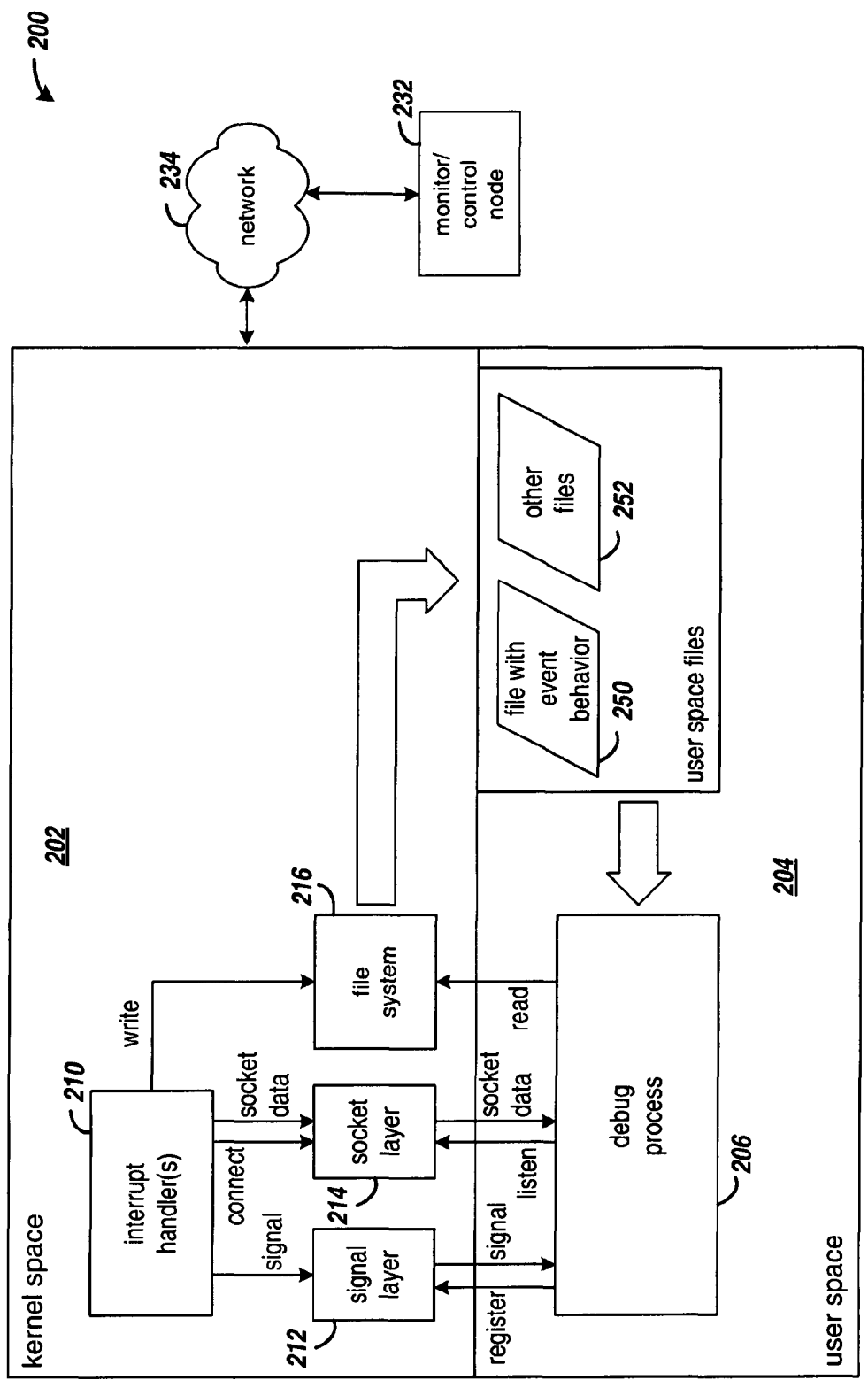
FIG. 2 is a block diagram that illustrates different mechanisms by which a debug process may be activated in response to an event monitor that generates an interrupt signal.

FIG. 2 is a block diagram that illustrates different mechanisms by which a debug process may be activated in response to an event monitor that generates an interrupt signal. Kernel space 202 and user space 204 together represent the memory space that is managed by the operating system. The kernel space is used by the operating system kernel for performing its system management functions and access is generally restricted for purposes of security and system integrity. The user space is memory space allocated by the operating system for use by an application process. In the example system, debug process 206 is an application-level process operating out of user memory space.

The interrupt handler(s) 210 is a kernel-level routine that is activated in response to an interrupt signal. The action taken by the interrupt handler depends on the object through which the hardware events are communicated. As described above, for example, the object may be an operating system-supported software signal, a socket, or a named pipe, which is a file. The software signal is supported by signal layer 212, the socket is supported by socket layer 214, and the named pipe is supported by file system 216.

The debug process 206 uses operating system API calls to indicate the desire to be notified of the occurrence of a hardware event. For an operating system-supported software signal, the process registers a callback function with the signal layer 212 to be invoked when the signal is asserted. The signal layer saves a reference to the callback function and returns control to the debug process, whose further processing is application dependent. In response to an interrupt, the interrupt handler changes the state of the signal associated with the interrupt, which causes the signal layer to invoke the callback function.

For a socket-based approach, the debug process makes an API call to the operating system to listen on a specified socket. In response, the socket layer suspends execution of the process. When the interrupt handler is executed in response to an interrupt signal, the interrupt handler makes a connection request on the socket via the socket layer. The debug process is awakened and thereafter accepts the connection request. If implemented to provide further data, the interrupt handler may write event and/or state data to the socket. The data may be streamed from the event monitor block in the programmable logic. The state data can be extra data from the circuit or the event data could be state data. The data written by the interrupt handler may be any permutation of event data and state data and may vary, depending on the event monitor being used. While not shown, it will be appreciated that another kernel space process may read from the socket data that is written by the user application process 206, and thereafter interface with the internal configuration controller (FIG. 1, 116) to update registers or configuration memory of the PLD.

It will be appreciated that the socket-based approach for hardware event reporting is amenable to networked control. For example, a process on a monitor/control node 232 may be coupled to the socket layer 214 via network 234. Through the socket, a process on node 232 may be notified of hardware events reported by interrupt handler 210.

In another embodiment, the user process may be notified of hardware events by way of files such as named pipes, which are supported by the UNIX® operating system. The user process 206 may reference a particular named pipe that is created for purposes of reporting hardware events. The file may be referenced by its hierarchical directory and file name. To use a pipe, the user process makes a file system call to read from the named pipe. If there is no outstanding (not yet recognized by the user process) hardware event, the pipe will be empty and the user process is suspended by the operating system until there is data available in the pipe. Once the interrupt handler is activated in response to an interrupt signal, the interrupt handler makes a file system call to write to the named pipe, and the data is written to a file 250 in user space. The named pipe is maintained along with other files 252 in user space.

FIG. 3 is a flowchart of an example process for detecting and responding to a hardware event on a programmable logic device using API calls to access an operating system object. The process generally entails the use of an event monitor that is coupled to the logic under analysis, along with an interrupt handler that updates an application-accessible operating system object.

At step 302, the PLD is configured with the logic under analysis and one or more suitable event monitors. The logic under analysis and event monitor(s) may be prepared using conventional design tools. Some tools may include a library of analyzer cores that may be adapted to generate an interrupt signal to a processor and integrated with a user's design. An analyzer core may implement a simple level or edge triggered circuit or more complex logic if required. Alternatively or in combination, an event monitor may be implemented as a circuit that monitors the configuration state of the PLD via an internal configuration access port as described above.

A PLD may also have a processor that is integrated with the programmable logic circuitry on the same integrated circuit die. Alternatively, the processor may be implemented on an integrated circuit die other than that of the programmable logic circuitry. In both implementations, at step 304 the processor is configured with an operating system, which includes a file system, and an application process. As discussed above, the application process may be useful for debugging the logic that is implemented on the PLD.

The logic on the PLD and the processor are started at step 306 to initiate analysis of the logic. The processor boots the operating system, and the application process is also started. At step 308, the application process makes an API call to access an operating system object. In one example embodiment, the object is an operating system-managed software signal. In another embodiment, the object is one supported by the file system, such as a socket or named pipe.

At step 310, the operation of the application process depends on the state of the object, which indicates whether an event was reported. For example, if the signal is not asserted, there is no connection request on the socket, or the pipe is empty. The logic under analysis continues to operate according to the input stimuli, and the application process is operated in an application-specific manner until an event is detected and reported. It will be appreciated that the different manners of operating the application process may include returning control to the application process so that the process may at some later time again poll the state of the object. Alternatively, the application may be suspended by the operating system when the object is in the first state and then resumed once the object transitions to the second state. In another embodiment, the application process may register a callback function with the operating system, and the operating system may invoke that callback function in response to the object changing to the second state.

In response to the state of a signal within or provided by the logic under analysis, an event monitor generates an interrupt signal to the processor at step 312. In response to the interrupt signal, the processor activates an interrupt handler at step 314. The interrupt handler executes on the processor and accesses the application-accessible object that is used to report the occurrence of the event. The access to the object depends on the object that is used to implement the event reporting.

At step 316, the operating system awakens the application process and resumes execution of the process in response to the interrupt handler's access to the operating system object. The application process may thereafter process the event. The actions taken in response to an event may vary between applications and may include actions such as storing data descriptive of the event in an event log, inputting and logging other data from the logic under analysis, analyzing the state of various data output by the logic under analysis, and/or halting or stepping the clock of the logic.

FIG. 4 is a flowchart of an example process in which the operating system object used in reporting a hardware event on a programmable logic device is an operating system software signal. At step 402, an application process registers with the operating system to be alerted to the activation of a selected operating system software signal(s). In one embodiment, the application process registers a callback function with the operating system. The registration of a callback function allows the application process to remain active, and the operating system may asynchronously alert the application process upon the occurrence of the event. At step 404, an interrupt handler is activated and executed on the processor in response to an interrupt signal from an event monitor, and the interrupt hander changes the state of the operating system software signal.

The operating system calls the callback function registered by the application process in response to the changed state of the software signalat step 406. It will be appreciated that the application process may have different signal handlers for different types of signals.

FIG. 5 is a flowchart of an example process in which the operating system object used in responding to a hardware event on a programmable logic device is a named pipe. At step 502, the application process reads from a named pipe. If the pipe is empty, the operating system suspends execution of the process. An interrupt handler is started and executed on the processor in response to an interrupt signal from an event monitor at step 504. The interrupt handler writes data to the named pipe to indicate occurrence of the event, and at step 506, the operating system resumes execution of the application process. The application process receives data from the pipe in response to the read request for which it was suspended.

FIG. 6 is a flowchart of an example process in which the operating system object used in responding to a hardware event on a programmable logic device is a socket. At step 602, the application process listens on a socket for a connection request. The operating system suspends the process until a connection request is received. At step 604, the interrupt handler is executed in response to an interrupt signal, and the interrupt handler presents a connection request on the socket. The socket layer of the operating system awakens the application process in response to the connection request at step 606.

At step 608, the application process accepts the connection request, and at step 610, the interrupt handler writes event-related data to the socket. The application process may then read the event-related data from the socket at step 612.

Figure 7:
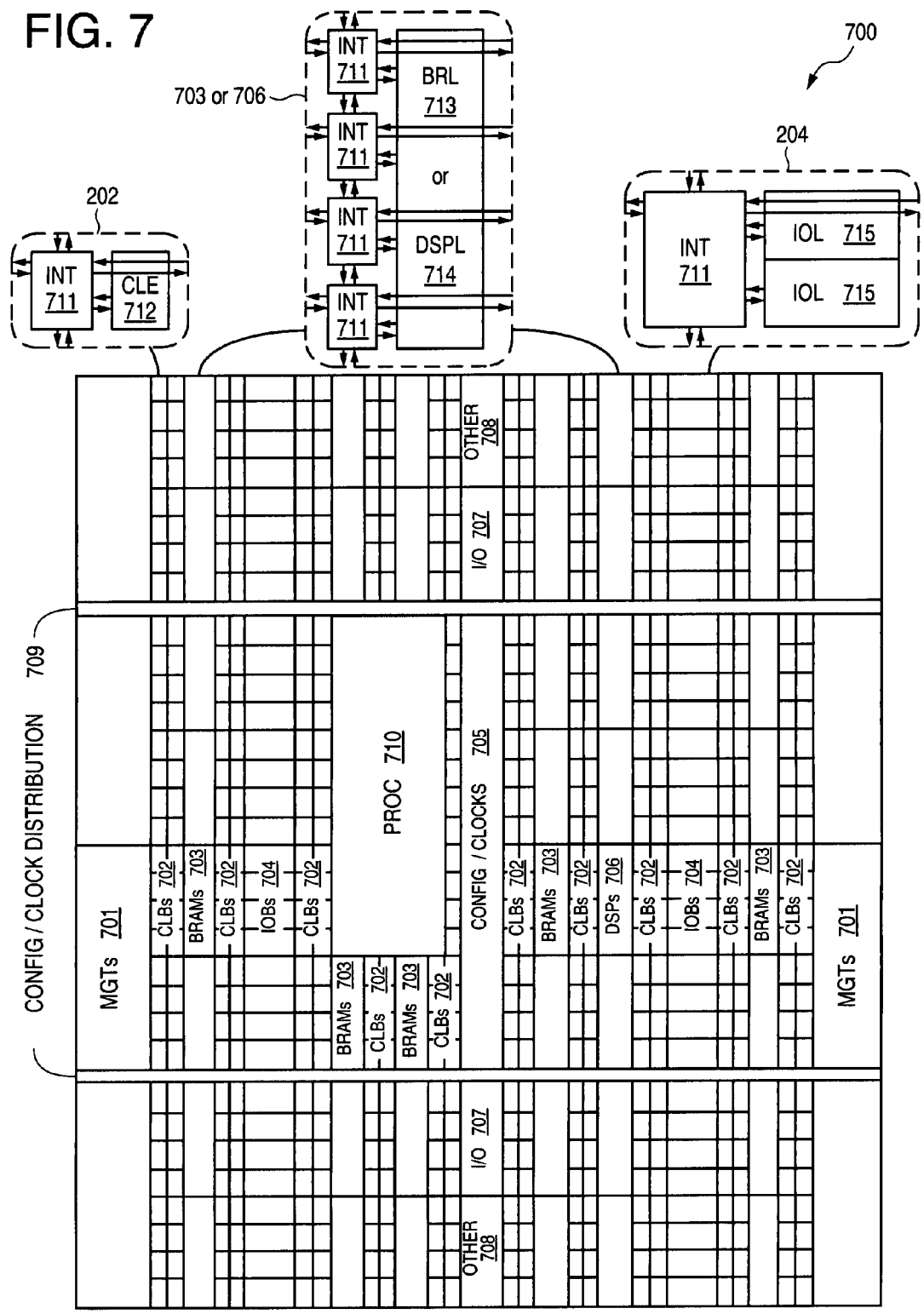
FIG. 7 is a block diagram of an example FPGA architecture that may be used in implementing various embodiments of the invention.

FIG. 7 is a block diagram of an example FPGA architecture that may be used in implementing various embodiments of the invention. FPGA architecture 700 includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for reporting events occurring in PLD hardware to software. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for reporting hardware events from circuitry implemented in an integrated circuit (IC), the method comprising:

configuring the IC with a circuit under analysis and a first event monitor circuit coupled to the circuit under analysis;

invoking, by a programmed processor and a first process executing thereon, an application programming interface (API) function that references a first object managed by an operating system (OS) executing on a processor, wherein the invoking of the API function includes a first parameter value that references one of a plurality of OS-managed objects;

operating the first process in a first manner in response to the invoking of the API function and the first object being in a first state;

generating a first interrupt signal by the first event monitor circuit to the processor in response to a first input signal from the circuit under analysis;

executing a first interrupt handler on the processor in response to the first interrupt signal;

accessing the first object by the first interrupt handler, wherein the first object is placed in a second state by the first interrupt handler; and operating the first process in a second manner different from the first manner in response to the first object transitioning to the second state.

2. The method of claim 1, wherein the first object comprises one of an OS-provided software signal and an OS-provided file system object.

3. The method of claim 1, wherein:
the operating the first process in the first manner includes suspending execution of the first process by the OS; and
the operating the first process in the second manner includes resuming execution of the first process by the OS.

4. The method of claim 1, wherein:
the operating the first process in the first manner includes returning control to the first process by the OS and the first process performing a first set of operations; and
the operating the first process in the second manner includes returning control to the first process by the OS and the first process performing a second set of operations that is different from the first set.

5. The method of claim 1, wherein:
the first object comprises an OS-provided software signal;
the invoking of the API function includes registering by the first process to have a callback function of the first process called by the OS in response to assertion of the OS-provided software signal; and
the accessing includes indicating by the first interrupt handler to the OS assertion of the OS-provided software signal.

6. The method of claim 1, wherein:
the first object comprises a named pipe;
the API function requests reading of data from the named pipe by the first process, and the operating the first process in the first manner includes suspending execution of the first process in response to the named pipe being empty; and
the accessing includes writing data to the named pipe by the first interrupt handler, and the second state is presence of data in the named pipe.

7. The method of claim 1, wherein:
the first object comprises a socket;
the API function requests listening for a connection request on the socket, and the operating the first process in the first manner includes suspending execution of the first process until a connection request is received;
the accessing includes requesting a connection on the socket by the first interrupt handler; and
the second state is presence of the connection request for the socket.

8. The method of claim 1, further comprising:
configuring the IC with a second event monitor circuit coupled to the circuit under analysis;
invoking, by a second process, the API function with a second parameter value that references a second object managed by the OS;
operating the second process in a third manner in response to invoking the API function and the second object being in a third state;
generating a second interrupt signal by the second event monitor circuit to the processor in response to a second input signal from the circuit under analysis;
executing a second interrupt handler on the processor in response to the second interrupt signal;
accessing the second object by the second interrupt handler, wherein the second object is placed in a fourth state by the second interrupt handler; and
operating the second process in a fourth manner different from the third manner in response to the second object transitioning to the fourth state.

9. The method of claim 1, further comprising:
configuring the IC with a second event monitor circuit coupled to the configuration memory of the IC;
invoking, by a second process, the API function with a second parameter value that references a second object managed by the OS;
operating the second process in a third manner in response to invoking the API function and the second object being in a third state;

reading back configuration data from the configuration memory by the second event monitor circuit;

generating a second interrupt signal by the second event monitor circuit in response to a state of the configuration data;

executing a second interrupt handler on the processor in response to the second interrupt signal;

accessing the second object by the second interrupt handler, wherein the second object is placed in a fourth state by the second interrupt handler; and operating the second process in a fourth manner in response to the second object transitioning to the fourth state.

10. The method of claim 1, further comprising:

generating the first interrupt signal a second time by the first event monitor circuit to the processor in response to a second assertion of the first input signal from the circuit under analysis;

executing the first interrupt handler a second time on the processor in response to each generation of the first interrupt signal;

wherein the accessing of the first object includes adding to a queue an indication of the occurrence of each event; and processing each indication in the queue by the first process after resuming execution.

11. The method of claim 1, wherein the processor and the circuitry are disposed on one integrated circuit die.

12. An article of manufacture, comprising:

a processor-readable storage medium configured with executable program code for reporting hardware events from circuitry implemented in an integrated circuit (IC), the program code when executed by one or more computer processors causing the one or more processors to perform operations including:

configuring the IC with a circuit under analysis and an event monitor circuit coupled to the circuit under analysis;

invoking, by a process, an application programming interface (API) function that references an object managed by an operating system (OS) executing on a processor, wherein the invoking of the API function includes a parameter value that references one of a plurality of OS-managed objects;

operating the process in a first manner in response to the invoking of the API function and the object being in a first state;

wherein the event monitor circuit is configured to generate an interrupt signal to the one or more processors in response to an input signal from the circuit under analysis;

executing an interrupt handler in response to the interrupt signal;

accessing the object by the interrupt handler, wherein the object is placed in a second state by the interrupt handler; and operating the process in a second manner different from the first manner in response to the object transitioning to the second state.

13. An electronic system comprising:

an integrated circuit (IC) configured with a circuit under analysis and an event monitor circuit coupled to the circuit under analysis, wherein the event monitor circuit is configured to generate an interrupt signal in response to an input signal from the circuit under analysis;

an interrupt controller coupled to the event monitor circuit, wherein the interrupt controller is configured to activate an interrupt handler in response to the interrupt signal; and a processor coupled to the interrupt controller, wherein:

the processor is configured to execute the interrupt handler, an operating system (OS), and a process;

the process invokes an application programming interface (API) function that references an object managed by the OS;

the invoking of the API function includes a parameter value that references one of a plurality of OS-managed objects;

the process is configured to operate in a first manner in response to the invoking of the API function and the object being in a first state;

the interrupt handler is configured to access and place the object in a second state; and the process is further configured to operate in a second manner different from the first manner in response to the object transitioning to the second state.

14. The system of claim 13, wherein the object comprises one of an OS-provided software signal and an OS-provided file system object.

15. The system of claim 13, wherein:

the process operated in the first manner suspends execution; and the process operated in the second manner resumes execution.

16. The system of claim 13, wherein:

the process operated in the first manner has control returned thereto by the OS and performs a first set of operations; and the process operated in the second manner has control returned thereto by the OS and performs a second set of operations that is different from the first set.

17. The system of claim 13, wherein:

the object comprises an OS-provided software signal;

the process is further configured to register, in the invocation of the API function, with the OS to have a callback function of the process called by the OS in response to assertion of the OS-provided software signal; and the interrupt handler is further configured to, in the access to the object, indicate to the OS assertion of the OS-provided software signal.

18. The system of claim 13, wherein:

the object comprises a named pipe;

the API function requests reading of data from the named pipe by the process, and the process is suspended in response to the named pipe being empty; and the interrupt handler is configured to write data to the named pipe during the access to the object, and the second state is presence of data in the named pipe.

19. The system of claim 13, wherein:

the object comprises a socket;

the API function requests listening for a connection request on the socket, and the process is suspended until a connection request is received;

the interrupt handler is configured to request a connection on the socket during the access to the object; and the second state is presence of a connection request for the socket.

20. The system of claim 13, wherein the IC and the processor are disposed on one integrated circuit die.

* * * * *